US006256846B1

(12) United States Patent
Lee

(10) Patent No.: US 6,256,846 B1
(45) Date of Patent: Jul. 10, 2001

(54) FASTENING DEVICE

(75) Inventor: Richard Lee, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/413,075

(22) Filed: Oct. 5, 1999

(30) Foreign Application Priority Data

Jun. 15, 1999 (TW) ................................................ 88209853

(51) Int. Cl.$^7$ ....................................................... H05K 7/20
(52) U.S. Cl. ............................................. 24/459; 361/704
(58) Field of Search ..................... 24/459, 625; 361/704, 361/707, 709, 710, 717–719; 257/718, 719, 726, 727; 165/80.2, 80.3

(56) References Cited

U.S. PATENT DOCUMENTS

| 5,295,043 | * | 3/1994 | Beijer . |
|---|---|---|---|
| 5,828,553 | * | 10/1998 | Chiou . |
| 5,933,325 | * | 8/1999 | Hou . |
| 5,979,025 | * | 11/1999 | Horng . |
| 5,991,152 | * | 11/1999 | Chiou . |
| 6,023,832 | * | 2/2000 | Boe . |
| 6,025,994 | * | 2/2000 | Chiou . |
| 6,111,752 | * | 8/2000 | Huang et al. . |

* cited by examiner

*Primary Examiner*—James R. Brittain
(74) *Attorney, Agent, or Firm*—Wei Te Chung

(57) ABSTRACT

A fastening device includes a base, a first locking portion and a second locking portion. The base is received in a central slot of a heat sink for providing a spring force and attaching the heat sink to a CPU package. The first and second locking portions each form an opening for engaging corresponding projections formed on lateral edges of a socket connector. A pair of extending plates is formed on lateral edges of the second locking portion. The extending plates are folded in an "L" shape and face each other thereby forming a receiving space for receiving an external tool. A locking plate or a locking hole is formed in the second locking portion for engaging with a locking element.

5 Claims, 5 Drawing Sheets

FASTENING DEVICE

BACKGROUND OF THE INVENTION

The present invention relates to a fastening device, and particularly to a fastening device for attaching a heat sink to a CPU package.

Fastening devices for attaching a heat sink to a CPU package are classified in two groups: one-piece type and two-piece type. A one-piece type fastening device is shown in FIG. 6 and comprises a base 21 and a pair of locking portions 22, 23 extending from lateral ends of the base 21. Each locking portion 22, 23 comprises an opening 24, 25. Since the one-piece type fastening device is rigid to provide a reliable locking force, assembly to a heat sink is difficult. FIG. 7 illustrates a two-piece type fastening device comprising a main plate 31 and a locking element 32 for attaching to a heat sink. However, since the locking element 32 of the two-piece type fastening device is pendular, the effects of external vibration cannot be reliably compensated.

Thus, there is a need for a new fastening device which is easily and reliably attached to a heat sink of a CPU package.

BRIEF SUMMARY OF THE INVENTION

A main object of the present invention is to provide a fastening device for facilitating attachment of a heat sink to a CPU package.

To fulfill the above-mentioned object, according to a preferred embodiment of the present invention, a fastening device comprises a base, a first locking portion and a second locking portion. The base is received in a central slot of a heat sink for providing a spring force and attaching the heat sink to a CPU package. The first and second locking portion each form an opening for engaging with corresponding projections formed on lateral edges of a socket connector. A pair of extending plates is formed on lateral edges of the second locking portion. The extending plates are folded in an "L" shape and face each other thereby forming a receiving space for receiving an external tool. A locking plate is formed in the second locking portion.

In another embodiment of the fastening device, a locking element is formed by stamping a metal plate. The locking element comprises a body and a handle. An engaging hole is formed in the body. In assembly, the body is received in the receiving space formed by the extending plates, and the engaging hole engages the locking plate. Thus, a heat sink can be securely attached to a CPU package by the fastening device.

In a further embodiment of the fastening device, a locking element comprises a body and a handle. A locking plate is formed in the body. A locking hole is formed on a second locking portion of the fastening device. In assembly, the locking plate engages the locking hole to attach a heat sink to a CPU package.

Other objects, advantages and novel features of the invention will become more apparent from the following detailed description when taken in conjunction with the accompanying drawings.

BRIEF DESCRIPTION OF THE DRAWINGS

FIG. 5 is a perspective view of a conventional fastening device; and

DETAILED DESCRIPTION OF THE INVENTION

Figure 1:
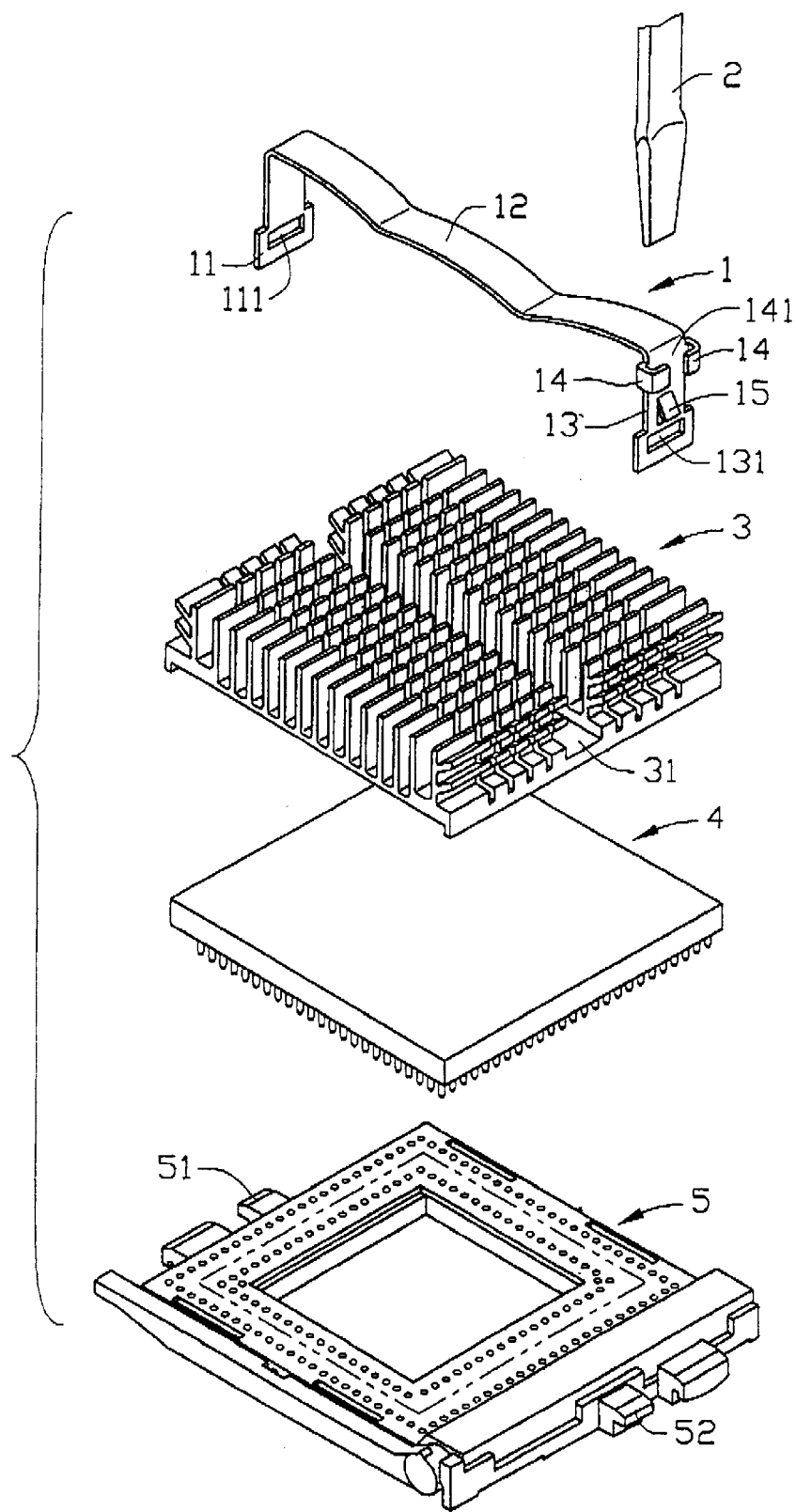
FIG. 1 is a perspective, unassembled view of a fastening device, a heat sink, a CPU package and a socket.

For facilitating understanding, like components are designated by like reference numerals throughout the description of the various embodiments as shown in the attached drawing figures.

Figure 2:
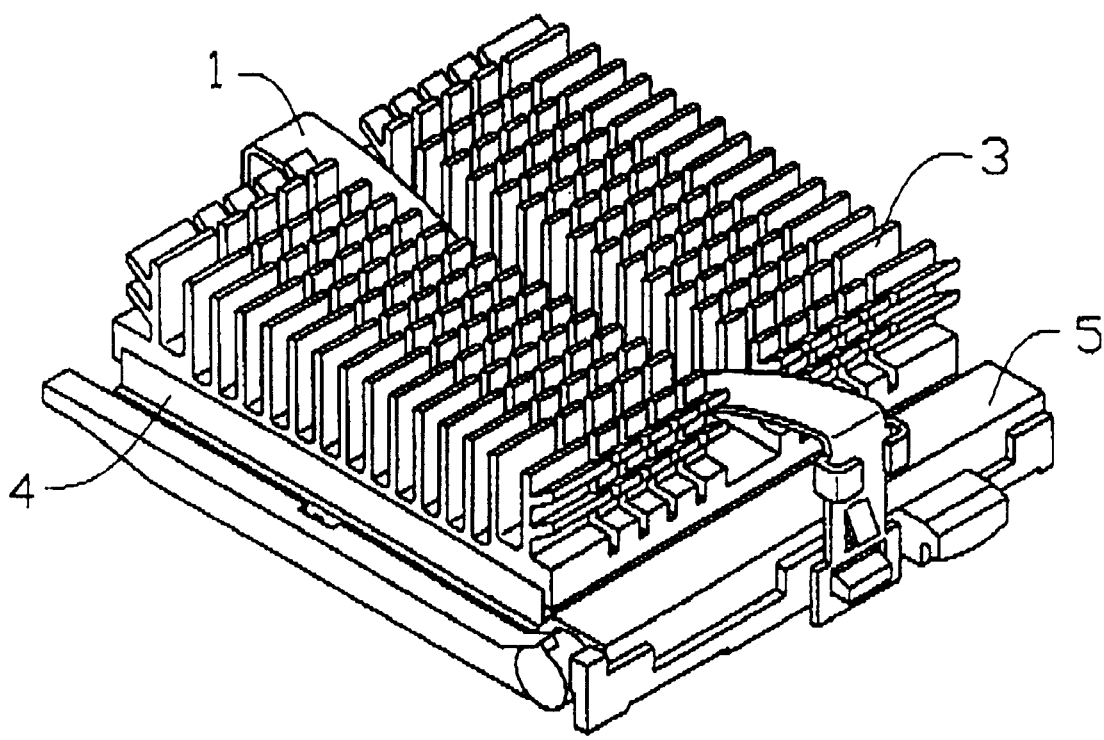
FIG. 2 is an assembled view of FIG. 1.

Referring to FIGS. 1 and 2, a fastening device 1 is formed by stamping a metal plate. The fastening device 1 comprises a base 12, a first locking portion 11 and a second locking portion 13. The base 12 is received in a central slot 31 of a heat sink 3 for providing a spring force and attaching the heat sink 3 to a CPU package 4. The first and second locking portions 11, 13 each form an opening 111, 131 for engaging corresponding projections 51, 52 formed on lateral edges of a socket connector 5.

A pair of extending plates 14 is formed on lateral edges of the second locking portion 13. The extending plates are folded in an "L" shape and face each other thereby forming a receiving space 141 for receiving an external tool 2. A locking plate 15 is formed on the second locking portion 13. In assembly, the CPU package 4 is mounted on the socket connector 5. The heat sink 3 is then positioned on the CPU package 4. The base 12 of the fastening device 1 is disposed in the central slot 31 of the heat sink 3. The opening 111 of the first locking portion 11 engages the projection 51, and the second locking portion 13 is then bent by the inserted external tool 2 whereby the opening 131 engages the projection 52. Thus, the fastening device 1 provides a spring force for securely attaching the heat sink 3 to the CPU package 4.

Figure 3:
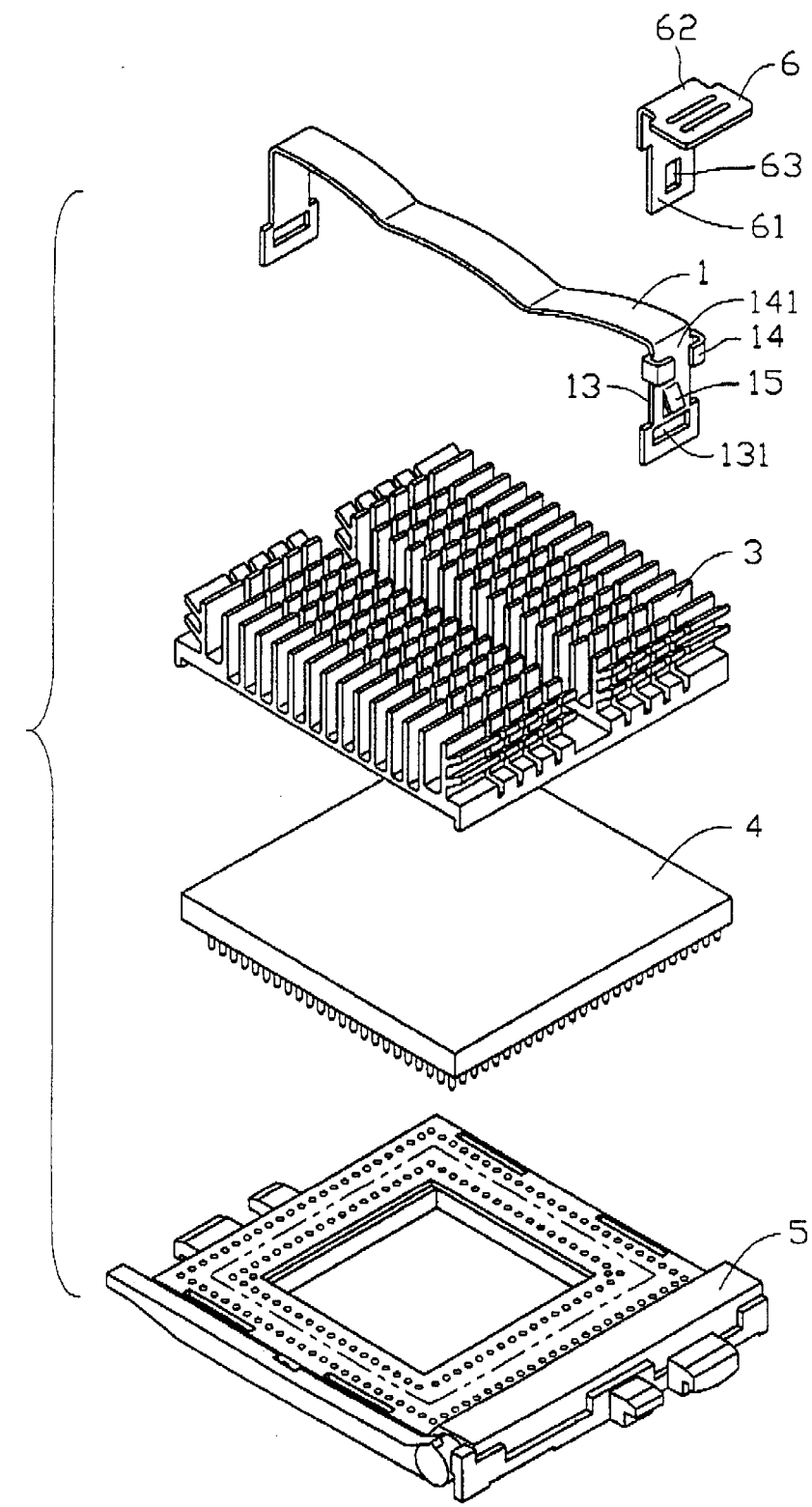
FIG. 3 is a perspective, unassembled view of a fastening device of another embodiment, a locking element, a heat sink, a CPU package and a socket.
Figure 4:
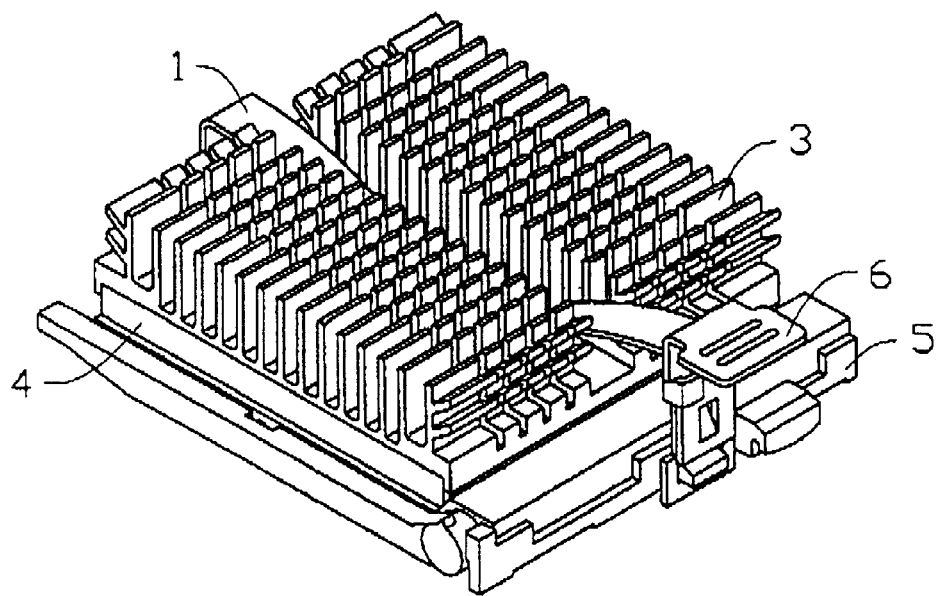
FIG. 4 is an assembled view of FIG. 3.

FIGS. 3 and 4 illustrate another embodiment of the invention. A locking element 6 is formed by stamping a metal plate. The locking element 6 comprises a body 61 and a handle 62. An engaging hole 63 is formed in the body 61. In assembly, the body 61 is received in the receiving space 141 formed by the extending plates 14, and the engaging hole 63 engages the locking plate 15. The heat sink 3 is then securely attached to the CPU package 4 by the fastening device 1 in a manner similar to that used in the first embodiment, but substituting use of the locking element 6 for the external tool 2.

Figure 5:
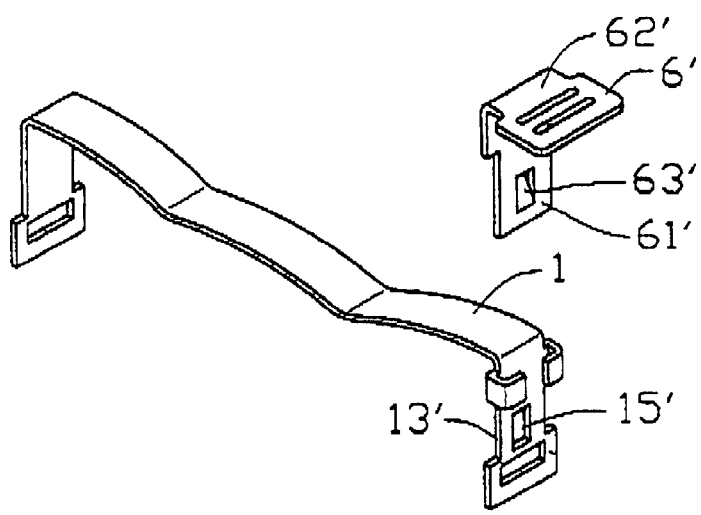
FIG. 5 is a perspective view of a further embodiment of a fastening device and locking element.
Figure 6:
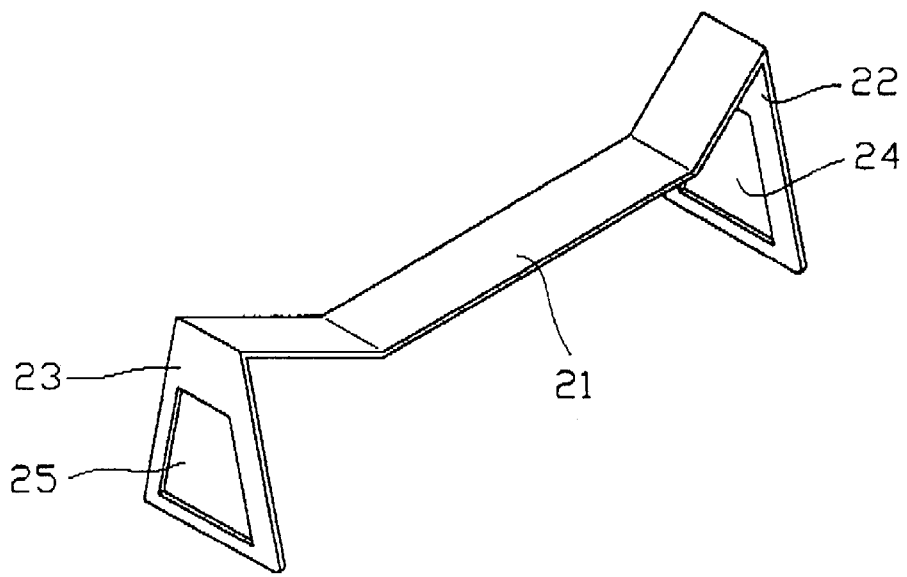
Figure 7:
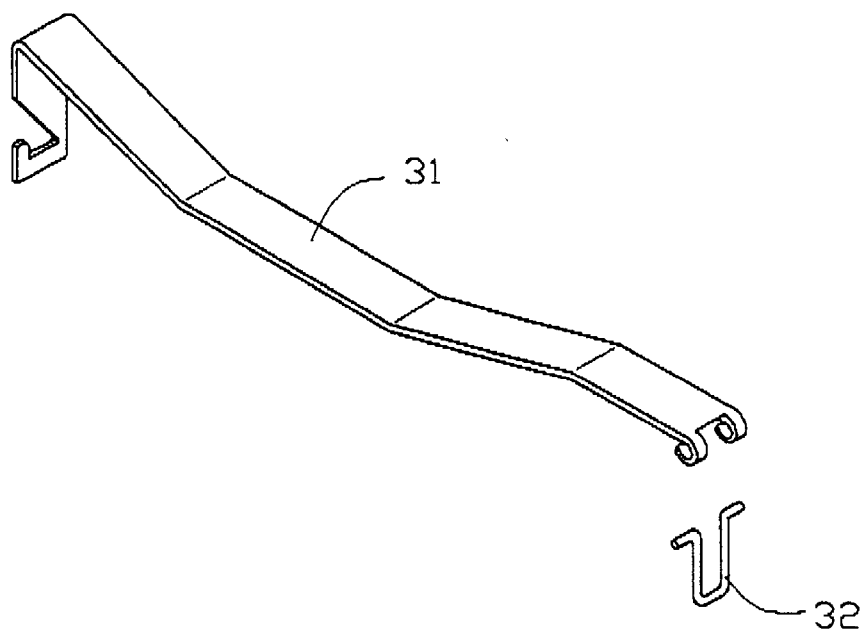
FIG. 7 is a perspective view of another conventional fastening device.

FIG. 5 illustrates a further embodiment of the invention. A locking element 6' comprises a body 61' and a handle 62'. A locking plate 63' is formed in the body 61'. A locking hole 15' is formed on a second locking portion 13' of the fastening device 1. In assembly, the locking plate 63' engages the locking hole 15' whereby the heat sink 3 is securely attached to the CPU package 4 using a method similar to that of the second embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastening device for attaching a heat sink to a CPU package which is mounted on a socket connector, comprising:

an arcuate base adapted for pressing a heat sink against a CPU package;

a first locking portion extending from an end of the base and forming an opening proximate a free end thereof, the opening being adapted to receive a projection formed on a socket connector;

a second locking portion extending from an opposite end of the base and comprising a locking plate and a pair of extending plates extending from lateral edges thereof to form a receiving space, an opening being formed in the second locking portion and being adapted to receive another projection formed on the socket connector; and a locking element inserted into the receiving space, the locking element having a body and a handle, the body having an engaging hole for receiving the locking plate of the second locking portion.

2. The fastening device as claimed in claim 1, wherein the extending plates are each folded in an "L" shape and individual free ends thereof extend toward each other.

3. A fastening device for attaching a heat sink to a CPU package which is mounted on a socket connector, comprising:

an arcuate base adapted for pressing a heat sink against a CPU package;

a first locking portion extending from an end of the base and forming an opening proximate a free end thereof, the opening being adapted to receive a projection formed on a socket connector;

a second locking portion extending from an opposite end of the base, an opening being formed in the second locking portion and being adapted to receive another projection formed on the socket connector;

a locking element including a body positioned beside and face to face abutting against the second locking portion, and a handle extending above the base and away from the second locking portion; and means for fastening the locking element to the second locking portion.

4. The fastening device as claimed in claim 3, wherein the extending plates are folded in an "L" shape and individual free ends thereof extend toward each other.

5. The fastening device as claimed in claim 3, wherein the means for fastening comprises a locking plate on the locking element and an engaging hole on the second locking portion for receiving the locking plate.

* * * * *